(12) United States Patent
Shiratake

(10) Patent No.: US 9,218,867 B2
(45) Date of Patent: Dec. 22, 2015

(54) MEMORY DEVICE AND MEMORY SYSTEM WITH SENSOR

(71) Applicant: KABUSHIKI KAISHA TOSHIBA, Minato-ku, Tokyo (JP)

(72) Inventor: Shinichiro Shiratake, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 132 days.

(21) Appl. No.: 14/198,398

(22) Filed: Mar. 5, 2014

(65) Prior Publication Data

US 2015/0055403 A1 Feb. 26, 2015

Related U.S. Application Data

(60) Provisional application No. 61/869,293, filed on Aug. 23, 2013.

(51) Int. Cl.
*G11C 8/12* (2006.01)
*G11C 11/16* (2006.01)
*G11C 8/06* (2006.01)
*G11C 7/18* (2006.01)
*G11C 7/10* (2006.01)

(52) U.S. Cl.
CPC .............. *G11C 11/1675* (2013.01); *G11C 8/06* (2013.01); *G11C 11/1653* (2013.01); *G11C 7/1006* (2013.01); *G11C 7/18* (2013.01); *G11C 8/12* (2013.01)

(58) Field of Classification Search
CPC .......... G11C 8/12; G11C 7/18; G11C 7/1006
USPC .............. 365/230.03, 189.12, 189.02, 189.16
See application file for complete search history.

(56) References Cited

U.S. PATENT DOCUMENTS

| 2006/0209585 | A1 | 9/2006 | Tanizaki et al. |
| 2008/0151678 | A1* | 6/2008 | Ikeda ........................ G11C 8/12 365/230.03 |
| 2009/0122598 | A1 | 5/2009 | Toda et al. |
| 2009/0201717 | A1 | 8/2009 | Maeda et al. |
| 2009/0323395 | A1 | 12/2009 | Ueda |

* cited by examiner

*Primary Examiner* — Jason Lappas
(74) *Attorney, Agent, or Firm* — Holtz, Holtz, Goodman & Chick PC

(57) ABSTRACT

According to one embodiment, a memory device includes: a nonvolatile memory that stores data according to a write access; an address memory that stores a first address described with a gray code; a first counter that counts up the first address for each write access, generates a second address as the count-up result, and supplies the second address to the nonvolatile memory; a rounding circuit configured to calculate a third address that is equal to or larger than a final output of the first counter and larger than the first address by one or a power of two after a series of write accesses is completed; and a controller that rewrites the third address in the address memory.

20 Claims, 15 Drawing Sheets

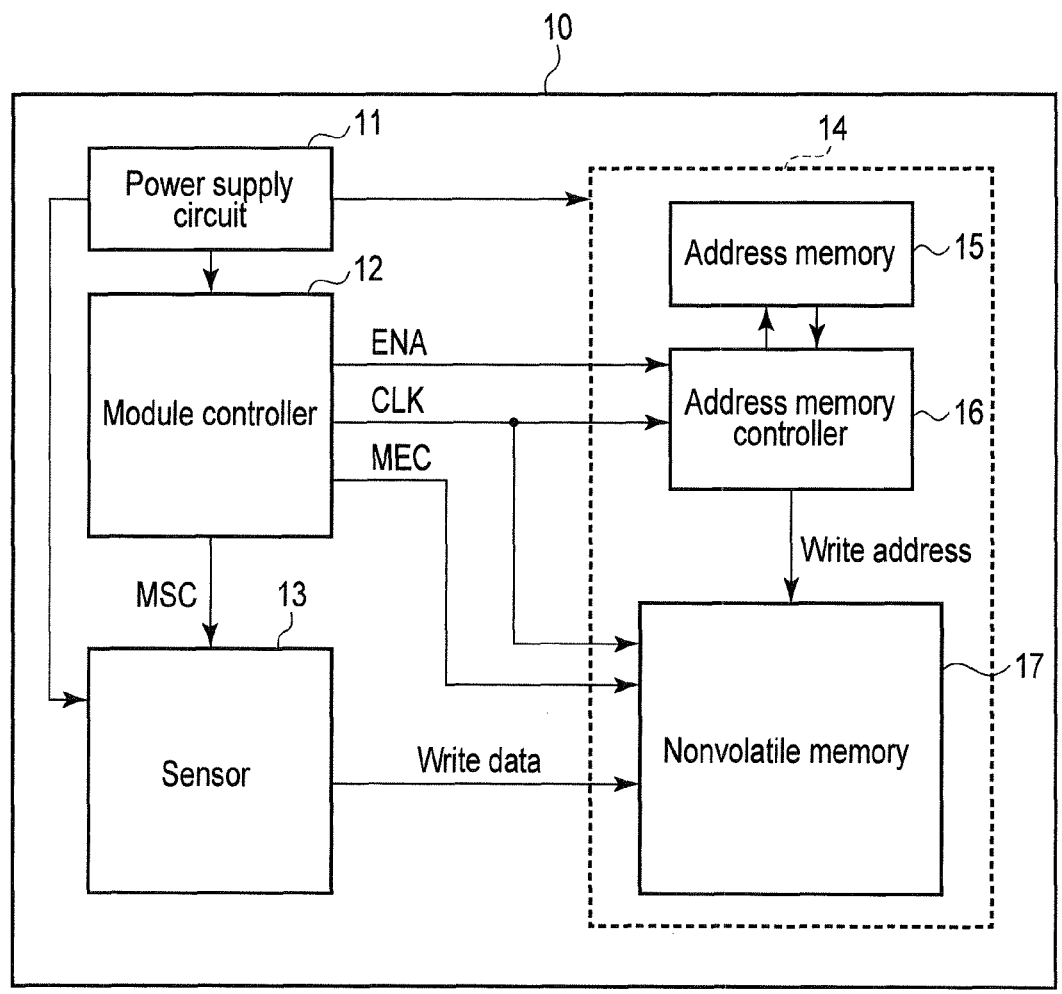
F I G. 1

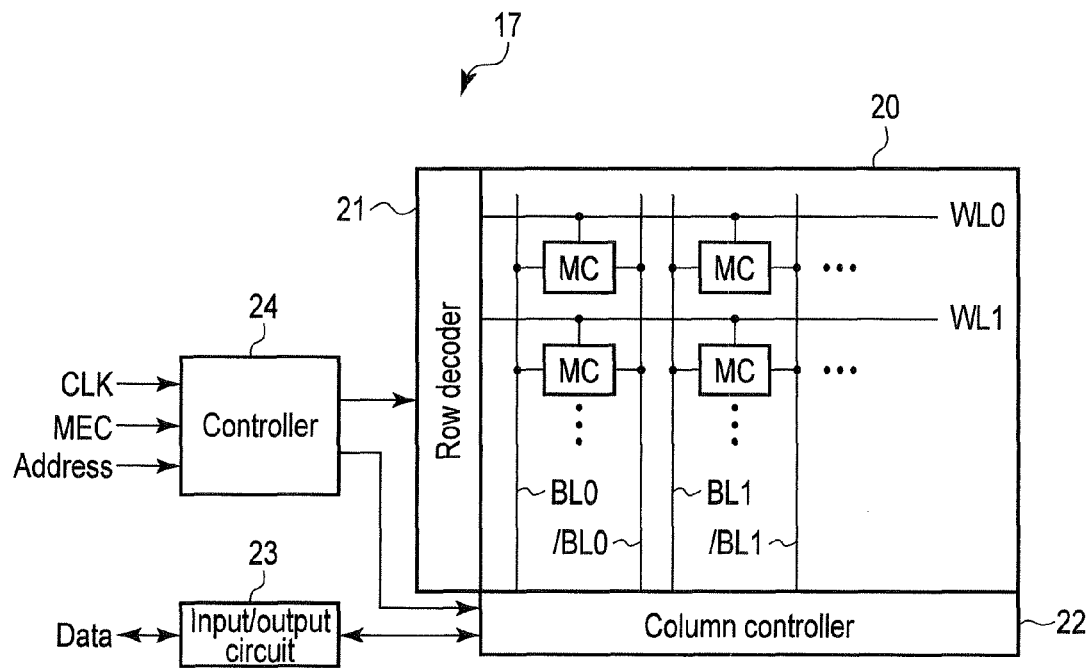
F I G. 2
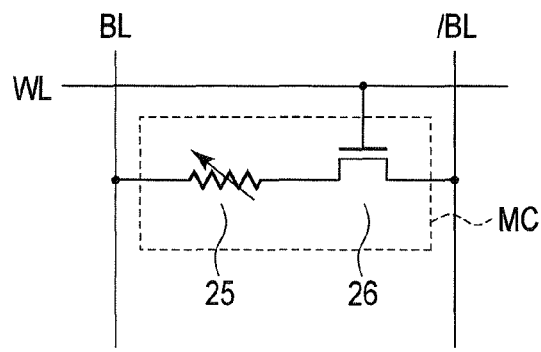
F I G. 3

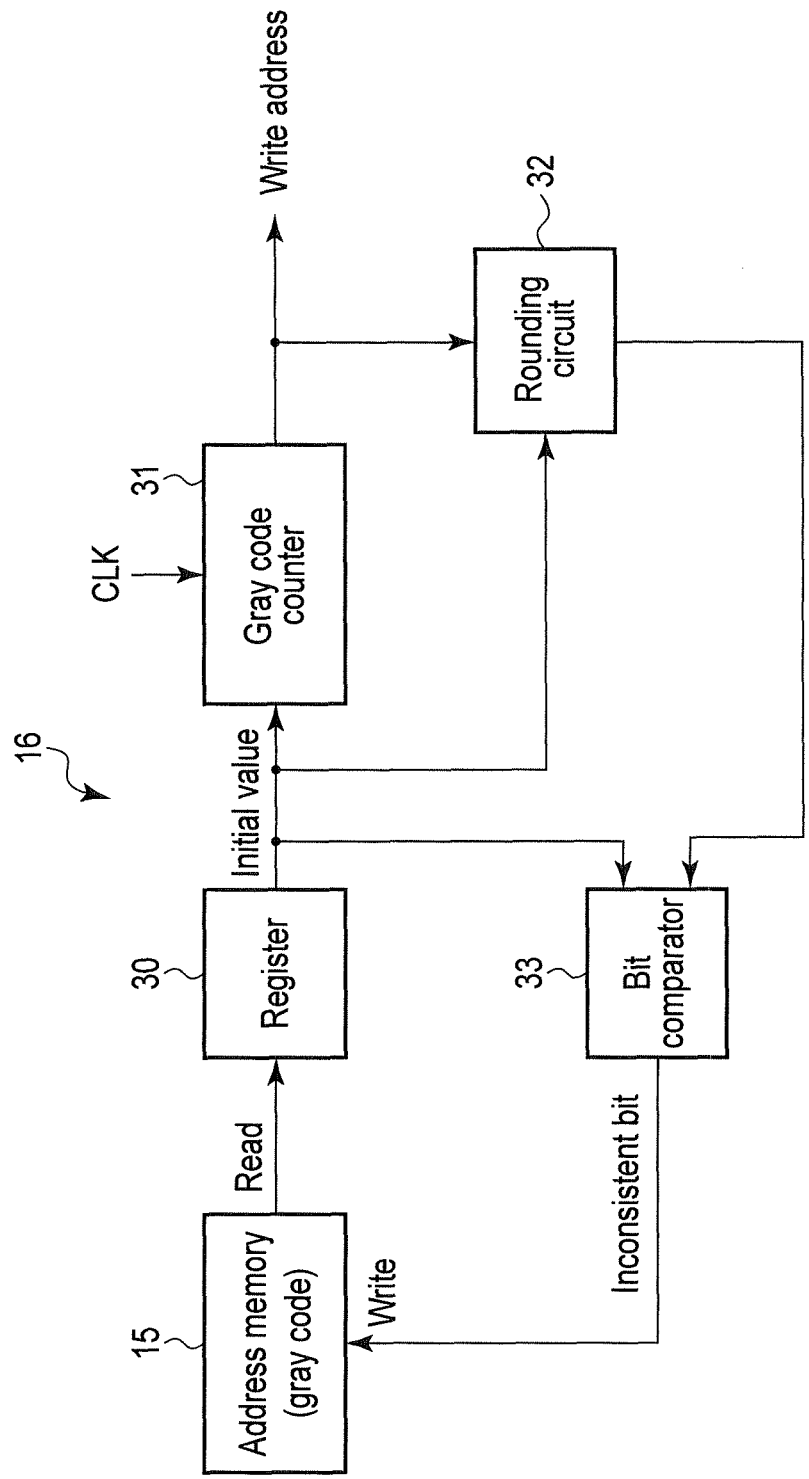
F I G. 4

| Binary | | | | | | | | Decimal | Gray code | | | | | | | |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 1 | 0 | 0 | 0 | 0 | 0 | 0 | 0 | 1 |
| 0 | 0 | 0 | 0 | 0 | 0 | 1 | 0 | 2 | 0 | 0 | 0 | 0 | 0 | 0 | 1 | 1 |
| 0 | 0 | 0 | 0 | 0 | 0 | 1 | 1 | 3 | 0 | 0 | 0 | 0 | 0 | 0 | 1 | 0 |
| 0 | 0 | 0 | 0 | 0 | 1 | 0 | 0 | 4 | 0 | 0 | 0 | 0 | 0 | 1 | 1 | 0 |
| 0 | 0 | 0 | 0 | 0 | 1 | 0 | 1 | 5 | 0 | 0 | 0 | 0 | 0 | 1 | 1 | 1 |
| 0 | 0 | 0 | 0 | 0 | 1 | 1 | 0 | 6 | 0 | 0 | 0 | 0 | 0 | 1 | 0 | 1 |
| 0 | 0 | 0 | 0 | 0 | 1 | 1 | 1 | 7 | 0 | 0 | 0 | 0 | 0 | 1 | 0 | 0 |
| 0 | 0 | 0 | 0 | 1 | 0 | 0 | 0 | 8 | 0 | 0 | 0 | 0 | 1 | 1 | 0 | 0 |
| 0 | 0 | 0 | 0 | 1 | 0 | 0 | 1 | 9 | 0 | 0 | 0 | 0 | 1 | 1 | 0 | 1 |
| 0 | 0 | 0 | 0 | 1 | 0 | 1 | 0 | 10 | 0 | 0 | 0 | 0 | 1 | 1 | 1 | 1 |
| 0 | 0 | 0 | 0 | 1 | 0 | 1 | 1 | 11 | 0 | 0 | 0 | 0 | 1 | 1 | 1 | 0 |
| 0 | 0 | 0 | 0 | 1 | 1 | 0 | 0 | 12 | 0 | 0 | 0 | 0 | 1 | 0 | 1 | 0 |
| 0 | 0 | 0 | 0 | 1 | 1 | 0 | 1 | 13 | 0 | 0 | 0 | 0 | 1 | 0 | 1 | 1 |
| 0 | 0 | 0 | 0 | 1 | 1 | 1 | 0 | 14 | 0 | 0 | 0 | 0 | 1 | 0 | 0 | 1 |
| 0 | 0 | 0 | 0 | 1 | 1 | 1 | 1 | 15 | 0 | 0 | 0 | 0 | 1 | 0 | 0 | 0 |
| 0 | 0 | 0 | 1 | 0 | 0 | 0 | 0 | 16 | 0 | 0 | 0 | 1 | 1 | 0 | 0 | 0 |
| 0 | 0 | 0 | 1 | 0 | 0 | 0 | 1 | 17 | 0 | 0 | 0 | 1 | 1 | 0 | 0 | 1 |
| 0 | 0 | 0 | 1 | 0 | 0 | 1 | 0 | 18 | 0 | 0 | 0 | 1 | 1 | 0 | 1 | 1 |
| 0 | 0 | 0 | 1 | 0 | 0 | 1 | 1 | 19 | 0 | 0 | 0 | 1 | 1 | 0 | 1 | 0 |
| 0 | 0 | 0 | 1 | 0 | 1 | 0 | 0 | 20 | 0 | 0 | 0 | 1 | 1 | 1 | 1 | 0 |
| 0 | 0 | 0 | 1 | 0 | 1 | 0 | 1 | 21 | 0 | 0 | 0 | 1 | 1 | 1 | 1 | 1 |
| 0 | 0 | 0 | 1 | 0 | 1 | 1 | 0 | 22 | 0 | 0 | 0 | 1 | 1 | 1 | 0 | 1 |
| 0 | 0 | 0 | 1 | 0 | 1 | 1 | 1 | 23 | 0 | 0 | 0 | 1 | 1 | 1 | 0 | 0 |
| 0 | 0 | 0 | 1 | 1 | 0 | 0 | 0 | 24 | 0 | 0 | 0 | 1 | 0 | 1 | 0 | 0 |
| 0 | 0 | 0 | 1 | 1 | 0 | 0 | 1 | 25 | 0 | 0 | 0 | 1 | 0 | 1 | 0 | 1 |
| 0 | 0 | 0 | 1 | 1 | 0 | 1 | 0 | 26 | 0 | 0 | 0 | 1 | 0 | 1 | 1 | 1 |
| 0 | 0 | 0 | 1 | 1 | 0 | 1 | 1 | 27 | 0 | 0 | 0 | 1 | 0 | 1 | 1 | 0 |
| 0 | 0 | 0 | 1 | 1 | 1 | 0 | 0 | 28 | 0 | 0 | 0 | 1 | 0 | 0 | 1 | 0 |
| 0 | 0 | 0 | 1 | 1 | 1 | 0 | 1 | 29 | 0 | 0 | 0 | 1 | 0 | 0 | 1 | 1 |
| 0 | 0 | 0 | 1 | 1 | 1 | 1 | 0 | 30 | 0 | 0 | 0 | 1 | 0 | 0 | 0 | 1 |
| 0 | 0 | 0 | 1 | 1 | 1 | 1 | 1 | 31 | 0 | 0 | 0 | 1 | 0 | 0 | 0 | 0 |
| 0 | 0 | 1 | 0 | 0 | 0 | 0 | 0 | 32 | 0 | 0 | 1 | 1 | 0 | 0 | 0 | 0 |
| 0 | 0 | 1 | 0 | 0 | 0 | 0 | 1 | 33 | 0 | 0 | 1 | 1 | 0 | 0 | 0 | 1 |
| 0 | 0 | 1 | 0 | 0 | 0 | 1 | 0 | 34 | 0 | 0 | 1 | 1 | 0 | 0 | 1 | 1 |
| 0 | 0 | 1 | 0 | 0 | 0 | 1 | 1 | 35 | 0 | 0 | 1 | 1 | 0 | 0 | 1 | 0 |

FIG. 5

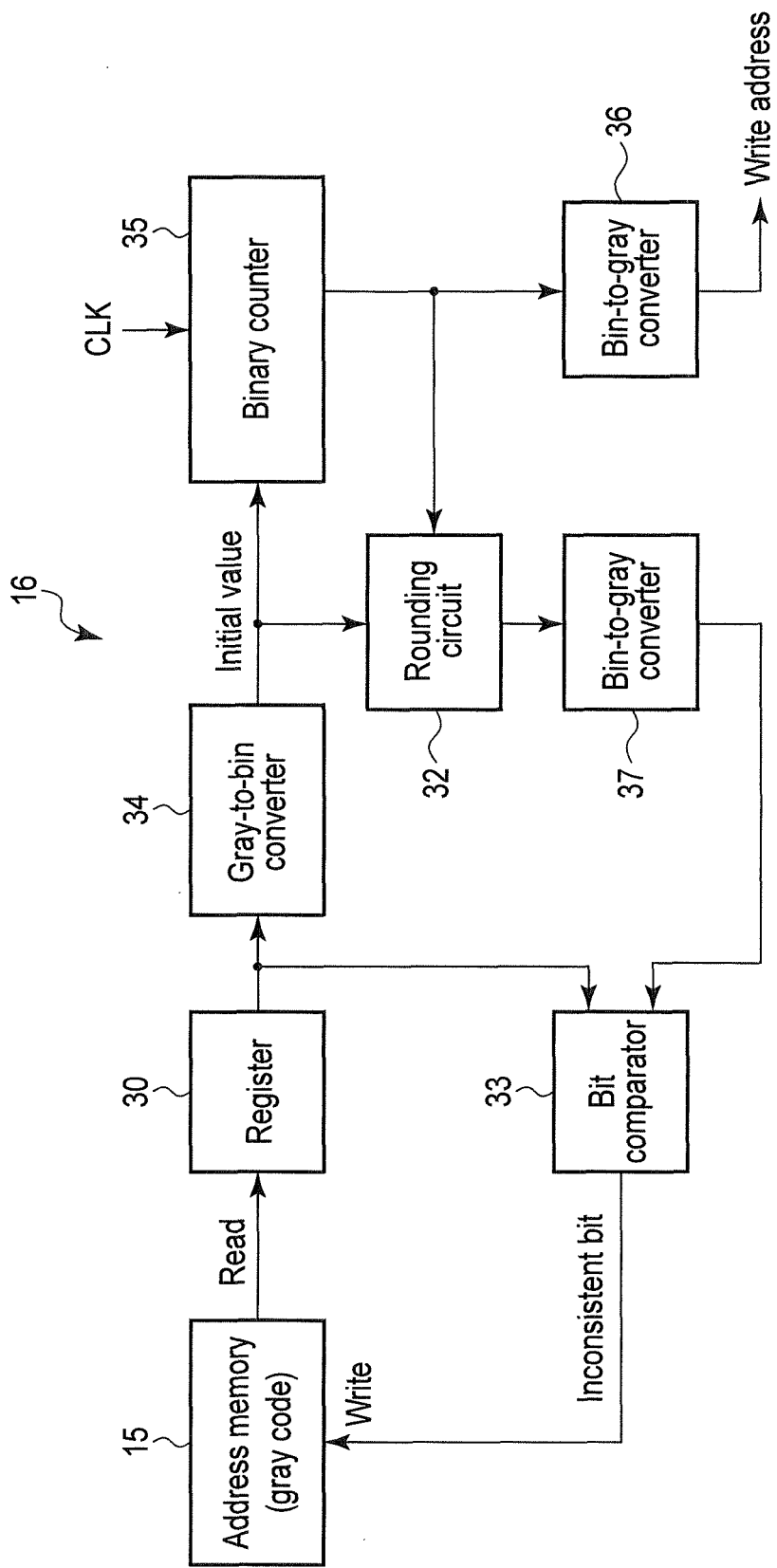
F I G. 7

| Input | Output |
|-------|--------|
| 0001 | 0001 |
| 0010 | 0010 |
| 0011 | 0100 |
| 0100 | 0100 |
| 0101 | 1000 |
| 0110 | 1000 |
| 0111 | 1000 |
| 1000 | 1000 |

FIG. 9

| Input | Output |
|-------|--------|
| 0000  | 0001   |
| 0001  | 0010   |
| 0010  | 0100   |
| 0011  | 0100   |
| 0100  | 1000   |
| 0101  | 1000   |
| 0110  | 1000   |
| 0111  | 1000   |

FIG. 12

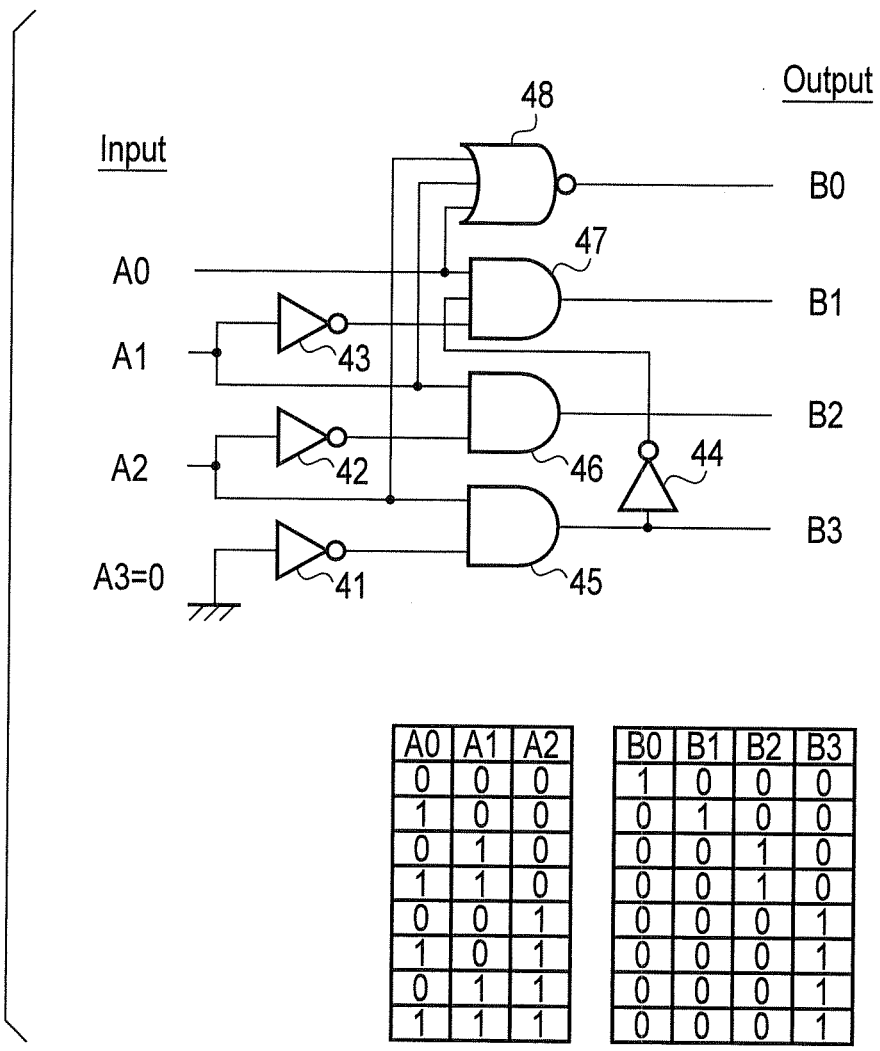
F I G. 13

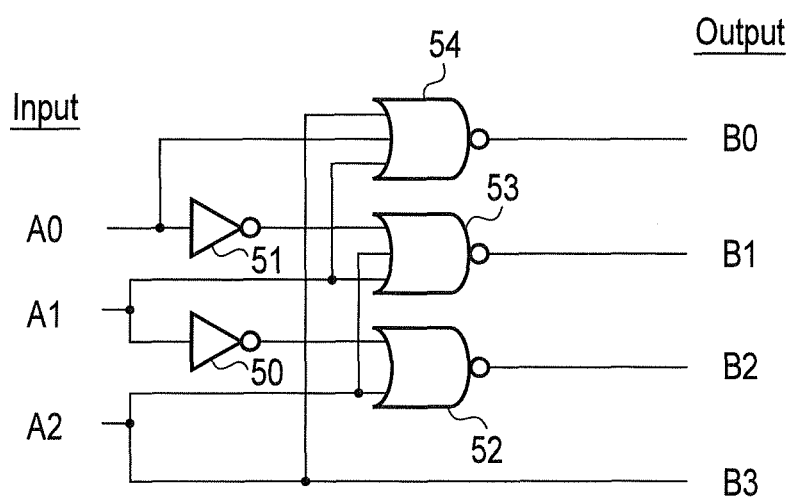
F I G. 14

MEMORY DEVICE AND MEMORY SYSTEM WITH SENSOR

CROSS-REFERENCE TO RELATED APPLICATIONS

This application claims the benefit of U.S. Provisional Application No. 61/869,293, filed Aug. 23, 2013, the entire contents of which are incorporated herein by reference.

FIELD

Embodiments described herein relate generally to a memory device and a memory system with a sensor.

BACKGROUND

An MRAM (Magnetic Random Access Memory) is known as a nonvolatile semiconductor memory.

BRIEF DESCRIPTION OF THE DRAWINGS

FIG. 1 is a block diagram of a memory system according to a first embodiment;
FIG. 2 is a block diagram of an MRAM;
FIG. 3 is a circuit diagram of one memory cell;
FIG. 4 is a block diagram of an address memory and address memory controller;
FIG. 5 is a diagram showing one example of a gray code;
FIG. 7 is a block diagram of an address memory and address memory controller according to a second embodiment;
FIG. 9 is a diagram showing the relationship between an input and output of an MSB extractor obtained when an address is formed of four bits;
FIG. 12 is a diagram showing the relationship between an input and output of an MSB extractor obtained when an address is formed of four bits;
FIG. 13 is a circuit diagram showing one example of the MSB extractor;
FIG. 14 is a circuit diagram showing another example of the MSB extractor.

DETAILED DESCRIPTION

Figure 6:
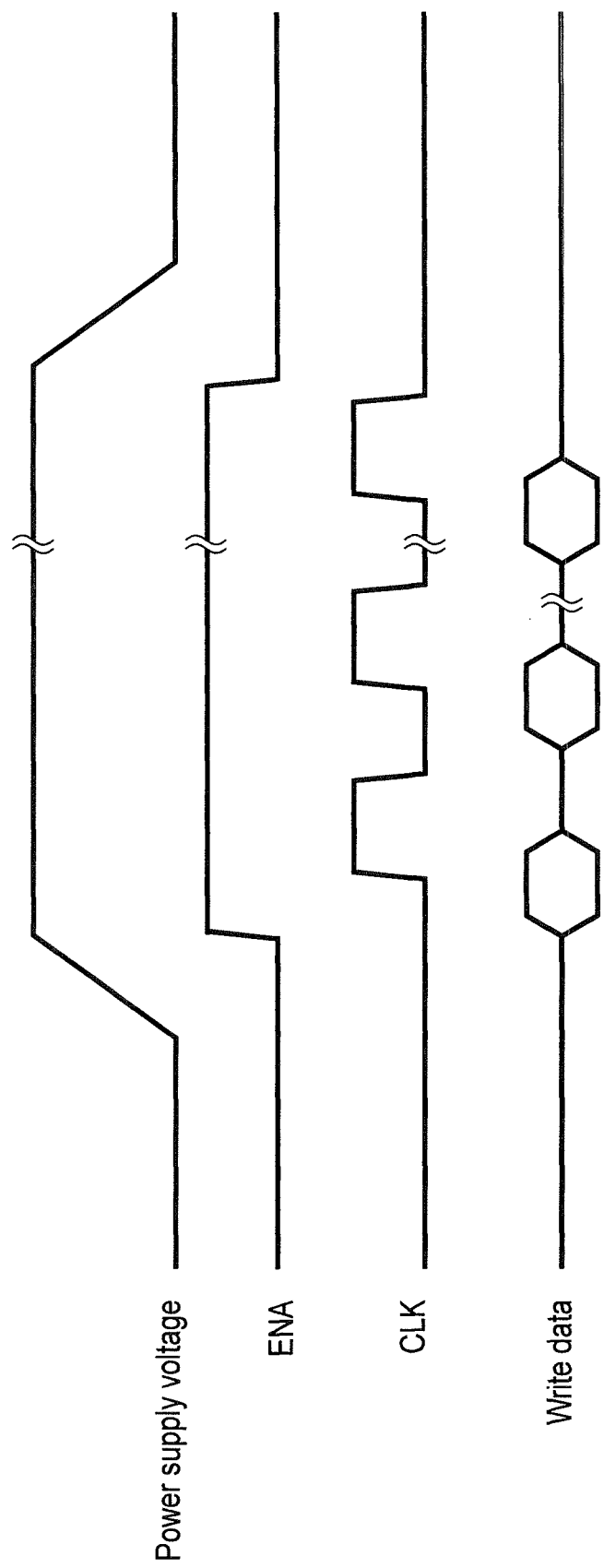
FIG. 6 is a timing chart showing signals supplied to a memory device.

According to one embodiment, a memory device comprises:
a nonvolatile memory that stores data according to a write access;
an address memory that stores a first address described with a gray code;
a first counter that counts up the first address for each write access, generates a second address as the count-up result, and supplies the second address to the nonvolatile memory;
a rounding circuit configured to calculate a third address that is equal to or larger than a final output of the first counter and larger than the first address by one or a power of two after a series of write accesses is completed; and
a controller that rewrites the third address in the address memory.

With the recent development of computer networks and miniaturization of communication devices and measurement units, a system such as machine to machine (M2M) in which information items are mutually exchanged between multiple devices without human operations to automatically optimize the operation control is proposed. In such a system, information items of various devices are transferred via the network. One example of the device is a sensor device, in which information items such as temperatures, vibrations, brightness, acceleration or angles are measured by means of various sensors and the measurement data are transmitted to the network. The operation power supply of the sensor device is obtained by use of a battery or energy harvest except a case wherein the stable power supply voltage is applied. Therefore, lowering the power consumption of components contained in the sensor device becomes more important in the field of M2M and sensor device networks. A memory used for storing measurement data is also one of the components of the device and, in embodiments, it is assumed that a nonvolatile memory is used and the technique related to lowering the power consumption is addressed.

In a nonvolatile memory having a mode in which the write process is successively performed to store the measurement results of the sensor, it is necessary to interrupt supply of the power of the nonvolatile memory to reduce a consumed current after completion of the write process. In this case, the nonvolatile memory itself should record an internal address used to continue the write process after the power supply is turned on next time. The object of this embodiment is to suppress the power consumption of the nonvolatile memory by reducing the number of to-be-rewritten bits of the nonvolatile memory as far as possible. In order to realize this, in the embodiments, the internal address is formed by a gray code and a circuit for controlling the internal address used for starting the write process to be rewritten only to a value obtained by increasing the previously stored address by a power of two is provided. As a result, the number of to-be-rewritten bits in the nonvolatile memory for address recording is 20 bits at maximum in the conventional technique since, for example, an address identifying a space of one megabit is expressed by 1M=1048576=2 to the power of twenty, but the number of to-be-rewritten bits is suppressed to two bits at maximum by applying the technique of the embodiments. As a result, the power consumption of the nonvolatile memory can be suppressed.

Embodiments of this invention are now described with reference to the accompanying drawings. In the following explanation, components having the same functions and configurations are denoted by the same symbols and a repetitive explanation is made only when required.

First Embodiment

1. Whole Configuration

FIG. 1 is a block diagram of a memory system 10 according to a first embodiment. The memory system 10 includes a power supply circuit 11, module controller 12, sensor 13 and memory device 14. The memory device 14 includes an address memory 15, address memory controller 16 and nonvolatile memory 17.

The sensor 13 makes measurements and transmits measurement data as write data to the nonvolatile memory 17. A write address used for storing measurement data in the nonvolatile memory is generated by means of the address memory 15 and address memory controller 16.

The module controller 12 controls the whole operation of the memory system 10. The module controller 12 transmits measurement control signal MSC to the sensor 13 to control the measurement operation of the sensor 13 by use of measurement control signal MSC. The module controller 12 transmits a write clock CLK and an enable signal ENA to the address memory controller 16. Further, the module controller 12 transmits the write clock CLK and memory control signal MEC to the nonvolatile memory 17 to control the operation of the nonvolatile memory 17 (for example, write operation) by use of the memory control signal MEC.

The power supply circuit 11 generates and supplies various power supply voltages to the module controller 12, sensor 13 and memory device 14. As the power supply circuit 11, for example, a battery, solar battery or energy harvest could be used. The memory system 10 may be configured to be applied external power supply voltages.

The address memory 15 is configured by use of a nonvolatile memory and stores address information in a nonvolatile fashion. Address information stored by means of the address memory 15 is the initial address generated when the previous write access is made to the nonvolatile memory 17. The address memory controller 16 reads address information (initial value) from the address memory 15. Then, the address memory controller 16 generates a write address by use of the address information and transmits the write address to the nonvolatile memory 17. Write access is made to the nonvolatile memory 17 by use of the write address.

For example, the memory system 10 could be configured by use of one semiconductor chip. Otherwise, the memory system 10 may be configured by a plurality of modules, each of modules is configured by a semiconductor chip and they are connected on a system board. Further, the memory system 10 may be configured as a multi-chip module in one package. Otherwise, the nonvolatile memory 17, address memory 15 and address memory controller 16 could be designed and manufactured as one semiconductor chip. In the present embodiment, a method for reading data stored in the nonvolatile memory 17 and outputting the data to the exterior of the memory system 10 is not clearly described, but a circuit having such a function can be additionally provided.

2. Configuration of Nonvolatile Memory 17

Next, a configuration example of the nonvolatile memory 17 is described. As the nonvolatile memory 17, various types of semiconductor memories such as an MRAM (Magnetic Random Access Memory), ReRAM (Resistive Random Access Memory), PCRAM (Phase-Change Random Access Memory) and flash memory (for example, NAND flash memory) can be used. In the present embodiment, one example in which an MRAM is used as the nonvolatile memory 17 is described.

FIG. 2 is a block diagram of the MRAM 17. The MRAM 17 includes a memory cell array 20, row decoder 21, column controller 22, input/output circuit 23 and controller 24.

The memory cell array 20 is configured by use of memory cells MC arranged in a matrix form. In the memory cell array 20, bit line pairs BL, /BL and word lines WL are arranged.

FIG. 3 is a circuit diagram of one memory cell MC. Memory cell MC includes a magnetoresistive effect element (MTJ (Magnetic Tunnel Junction) element) 25 and select transistor 26. As the select transistor 26, for example, an n-channel MOSFET is used. One end of the MTJ element 25 is connected to a bit line BL and the other end thereof is connected to the drain of the select transistor 26. The gate of the select transistor 26 is connected to a word line WL and the source thereof is connected to a bit line /BL.

The row decoder 21 is connected to the word lines WL. The row decoder 21 selects one of the word lines WL based on a row address.

The column controller 22 is connected to the bit line pairs BL, /BL. In the data write mode, the column controller 22 selects one of the bit line pairs based on a column address and passes a write current through a selected memory cell via the selected bit line pair to write data in the selected memory cell. Further, in the data read mode, the column controller 22 selects one of the bit line pairs based on a column address to read data from the selected bit line pair. In order to perform the above operation, the column controller 22 is configured to include a column decoder, a column selector, sense amplifiers, a write driver and the like.

The input/output circuit 23 transmits write data input from the exterior to the column controller 22 and outputs read data input from the column controller 22 as output data to the exterior.

The controller 24 generally controls various operations of the MRAM 17. For example, the controller 24 receives an address, write clock CLK and memory control signal MEC from the exterior and controls the write operation and read operation based on the above signals.

3. Configuration of Address Memory 15 and Address Memory Controller 16

The configuration of the address memory 15 and address memory controller 16 is now described in more detail. FIG. 4 is a block diagram of the address memory 15 and address memory controller 16. The address memory controller 16 corresponds to the components other than the address memory 15 among the components of FIG. 4. That is, the address memory controller 16 includes a register 30, gray code counter 31, rounding circuit 32 and bit comparator 33.

In the present embodiment, address information stored in the address memory 15 is described with a gray code. FIG. 5 is a diagram showing one example of a gray code. The gray codes are codes in which the number of bits that vary between adjacent codes is always one. In FIG. 5, the relationship between binary codes, decimal codes and gray codes is shown.

The register 30 temporarily stores address information read from the address memory 15. The gray code counter 31 counts up address information (gray code) stored in the register 30 each time write clock CLK is input.

The rounding circuit 32 rounds the final output of the gray code counter 31 to set the number of bits to be rewritten in the address information read from the address memory 15 to two bits at maximum. Specifically, the rounding circuit 32 outputs a value that is equal to or larger than the final output of the gray counter 31 and larger than the output of the register 30 (initial value of the gray code counter 31) by one or a power of two, for example, 2, 4, 8, . . . .

The bit comparator 33 compares the output of the rounding circuit 32 with the output of the register 30 for each bit. Then, the bit comparator 33 transmits only bits that are inconsistent with the original value to the address memory 15.

4. Operation

The operation of the memory system 10 with configuration described above is described. FIG. 6 is a timing chart showing signals supplied to the memory device 14.

When the power supply of the memory system 10 is turned on, the module controller 12 asserts the enable signal ENA. Then, the module controller 12 generates the write clock CLK which is in response to write accesses and transmits write data from the sensor 13 to the nonvolatile memory 17 in synchronism with the write clock CLK.

Further, the address memory controller 16 supplies a write address to the nonvolatile memory 17 in synchronism with write clock CLK. Specifically, when the enable signal ENA is asserted, the address memory controller 16 reads address information from the address memory 15 and counts up the write address each time the write clock CLK is input where the address information is used as an initial value. The nonvolatile memory 17 stores write data at the memory cell of the write address.

When a series of write accesses is completed, the module controller 12 negates the enable signal ENA. Once the enable signal ENA is negated, the address memory controller 16 writes address information in the address memory 15. The address information written in the address memory 15 here is the final address used in the series of write accesses and will be read and becomes an initial value when the enable signal ENA is next asserted. After this, the module controller 12 interrupts supply of the power from the power supply circuit 11.

In the present embodiment, the enable signal ENA is supplied from the exterior of the memory device 14. However, the memory device 14 may include a circuit that detects the level of the power supply, for example, and the memory device 14 may be configured to assert the enable signal ENA when the power supply voltage becomes equal to or higher than a preset first potential and negate the enable signal ENA when the power supply voltage becomes equal to or lower than a preset second potential. For stable operation of the circuit, it is desirable to set the second potential lower than the first potential.

Next, a more detailed operation of the address memory controller 16 is described with reference to FIG. 4. When the enable signal ENA is asserted, the address information is read from the address memory 15 and is temporarily stored in the register 30. The address information stored in the register 30 is used as an initial value of the gray code counter 31.

The module controller 12 activates the write clock CLK at each time of write access to the nonvolatile memory 17. The gray code counter 31 counts up the address from the initial value according to the gray code rule for each pulse of the write clock CLK. For a write access to the nonvolatile memory 17, an output of the gray code counter 31 is used as a write address. That is, write accesses are made to the nonvolatile memory 17 sequentially from an address next to the address stored in the address memory 15 after the memory system 10 is started. There are several known circuits as the gray code counter 31 of the present embodiment and therefore a detailed description thereof is omitted here.

When a series of write accesses is completed, the enable signal ENA is negated and the rounding circuit 32 outputs a value that is the equal to or larger than the final output of the gray code counter 31 and larger than the output of the register 30 (initial value of gray code counter 31) by one or a power of two, for example, 2, 4, 8, . . . .

The bit comparator 33 compares the output of the rounding circuit 32 with the output of the register 30 for each bit. Only bits that are inconsistent as the result of comparison by the comparator 33 are written in the address memory 15. Bits that are consistent are not written and the original values (read data) are maintained. Due to the characteristic of the gray code, the number of to-be-rewritten bits is two at maximum when the address changed by a power of two.

5. Effect

As a comparison example, if address information stored in the address memory 15 is not formed of a gray code but formed of a binary code and a binary counter is used instead of the gray code counter 31, for example, it is necessary to rewrite four bits when a 4-bit address is changed by one from "0111" to "1000". For example, since an address is 20 bits in a memory being accessed by use of addresses of 1 megabit, there is a possibility that 20 bits may be rewritten at maximum.

On the other hand, in the present embodiment, when address information stored in the address memory 15 is rewritten after a series of write accesses (all of the write accesses from the time when the enable signal ENA is asserted until the signal is negated) is completed, the number of to-be-rewritten bits is suppressed to two at maximum. As a result, the power consumption required for rewriting address information stored in the address memory 15 can be greatly reduced.

Further, write access is made to the nonvolatile memory 17 by use of a write address formed of a gray code that is the output of the gray code counter 31. Therefore, since a change in an address for each write access can be suppressed to one bit, the number of address lines which are charged and discharged can be reduced and, as a result, the power consumption can be reduced.

Data is not written in a storage region corresponding to an address skipped by rounding circuit 32 in the storage region of the nonvolatile memory 17. For example, the unwritten region may be managed by writing an invalid flag in the unwritten region.

Second Embodiment

A second embodiment is an embodiment in which a counter that counts up an address is configured by a binary counter, which can be easily realized. FIG. 7 is a block diagram of an address memory 15 and address memory controller 16 according to the second embodiment. The address memory controller 16 includes a register 30, rounding circuit 32, bit comparator 33, gray-to-bin converter 34, binary counter 35 and bin-to-gray converters 36, 37.

The gray-to-bin converter 34 converts address information formed of a gray code to a binary code. The binary counter 35 counts up address information converted to a binary code by the gray-to-bin converter 34 each time the write clock CLK is input. The bin-to-gray converters 36, 37 each convert address information formed of a binary code to a gray code.

In order to convert a gray code to a binary, the exclusive OR (XOR) of a bit and all of the more significant bits than that bit is calculated. For example, the following operations are performed to convert a 4-bit gray code address G3, G2, G1, G0 to a binary B3, B2, B1, B0.

B3=G3
B2=G3 XOR G2
B1=G3 XOR G2 XOR G1
B0=G3 XOR G2 XOR G1 XOR G0

In order to convert a binary to a gray code, the exclusive OR of a bit and a bit that is one-bit more significant than that bit is calculated. For example, the following operations are performed to convert 4-bit binary B3, B2, B1, B0 to a gray code address G3, G2, G1, G0.

G3=B3
G2=B3 XOR B2
G1=B2 XOR B1
G0=B1 XOR B0

The exclusive OR operation is known in the art and therefore a detailed explanation thereof is omitted here.

The operation of the address memory controller 16 with the above configuration is now described. Address information stored in the register 30 is supplied to the gray-to-bin converter 34. The gray-to-bin converter 34 converts address information formed of a gray code to a binary according to the table of FIG. 5. Address information converted to a binary by the gray-to-bin converter 34 is used as an initial value of the binary counter 35.

The module controller 12 activates the write clock CLK each time write access is made to the nonvolatile memory 17. The binary counter 35 counts up the address from the initial value for each pulse of the write clock CLK.

The bin-to-gray converter 36 converts a count of the binary counter 35 to a gray code according to the table of FIG. 5. For write access to the nonvolatile memory 17, a gray code converted by the bin-to-gray converter 36 is used as a write address.

When a series of write accesses is completed, the enable signal ENA is negated and the rounding circuit 32 outputs a value that is equal to or larger than the final output of the binary counter 35 and larger than the output of the gray-to-bin converter 34 (initial value) by one or a power of two, for example, 2, 4, 8, . . . . The bin-to-gray converter 37 converts an output of the rounding circuit 32 formed of a binary to a gray code.

The bit comparator 33 compares the output of the bin-to-gray converter 37 with the output of the register 30 for each bit. Only bits that are inconsistent as the result of comparison by the bit comparator 33 are written in the address memory 15. Bits that are consistent are not written and the original values (read data) are maintained. Due to the characteristic of the gray code, the number of to-be-rewritten bits is two at maximum when the address changed by a power of two. As a result, the same effect as that of the first embodiment can be obtained.

Further, a binary is converted to a gray code by the bin-to-gray converter 36 and write access is made to the nonvolatile memory 17 by use of a write address formed of the gray code. Therefore, since a change in an address for each write access can be suppressed to one bit, the number of address lines which are charged and discharged can be reduced and, as a result, the power consumption can be reduced. The count of the binary counter 35 can be used as a write address. That is, the bin-to-gray converter 36 can be omitted and write access is made to the nonvolatile memory 17 by use of a write address formed of a binary.

Third Embodiment

Figure 8:
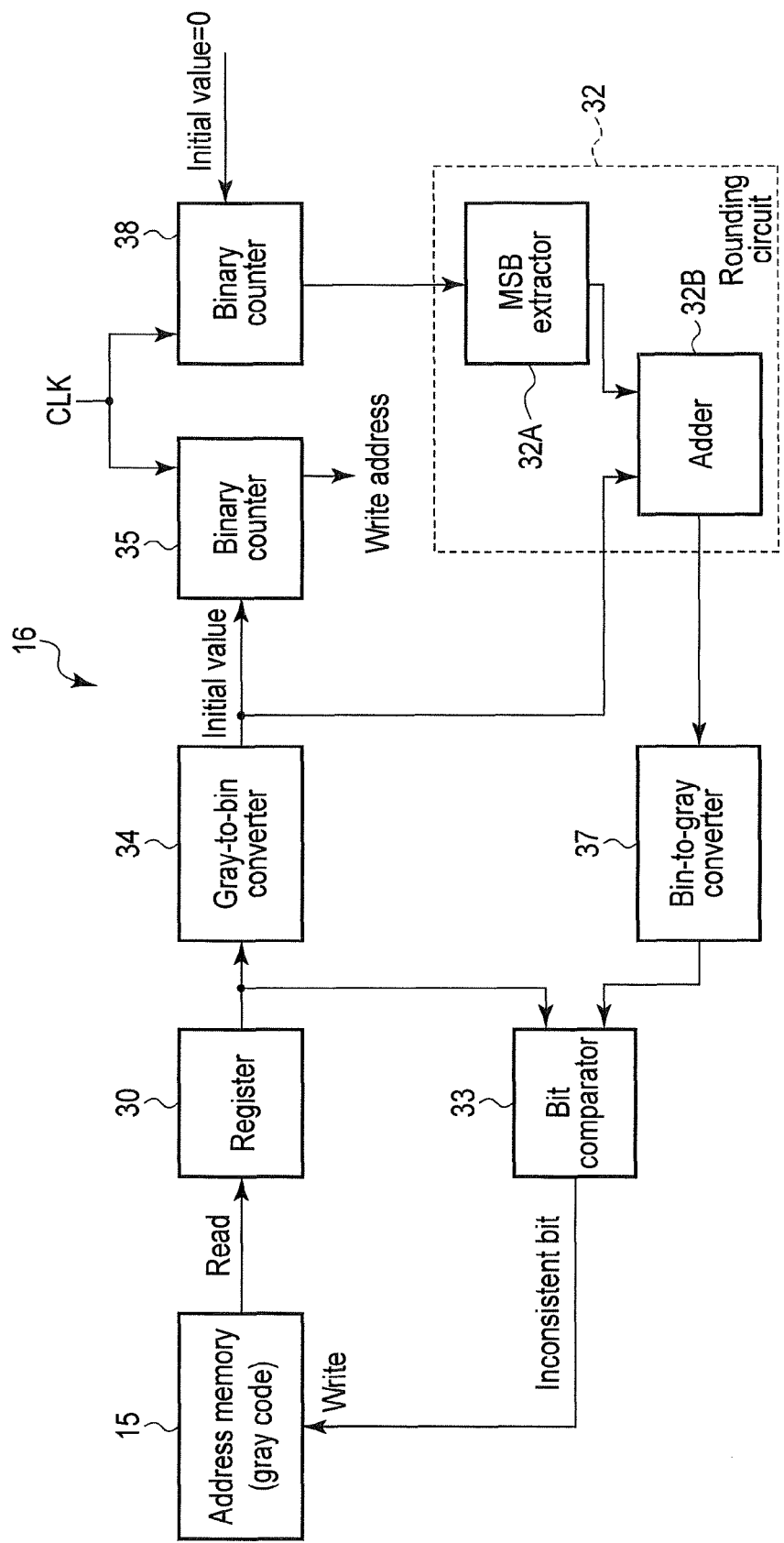
FIG. 8 is a block diagram of an address memory and address memory controller according to a third embodiment.

A third embodiment shows a concrete configuration example of a rounding circuit 32. FIG. 8 is a block diagram of an address memory 15 and address memory controller 16 according to the third embodiment.

A binary counter 38 whose initial value is "0" is newly provided in parallel with the binary counter 35 that uses a value read from the address memory 15 and is supplied via the gray-to-bin converter 34 as an initial value. The binary counter 38 counts up an address from an initial value=0 in response to the write clock CLK generated for each write access. An output of the binary counter 35 is used as a write address.

The rounding circuit 32 includes an MSB (most significant bit) extractor 32A and adder 32B. After a series of write accesses is completed (the enable signal ENA is negated), the MSB extractor 32A (1) outputs the final output of the binary counter 38 as it is when the final output is one or a power of two and (2) outputs a value that is larger than the final output of the binary counter 38 and is a power of two when the final output is neither one nor a power of two. More specifically, first, the MSB extractor 32A extracts the MSB of the final output of the binary counter 38. Then, the MSB extractor 32A outputs the final output of the binary counter 38 as it is when the final output is 1. Further, a binary that is a power of two has 1 in only one bit and 0 in the other bits. Therefore, the MSB extractor 32A outputs the final output of the binary counter 38 as it is when the final output of the binary counter 38 has only one bit of 1 and outputs a value that is a power of two in which only the more significant bit next to the MSB is 1 when the final output of the binary counter 38 has plural bits of 1.

FIG. 9 is a diagram showing the relationship between an input and output of the MSB extractor 32A obtained when an address is formed of four bits. The MSB extractor 32A outputs a value of a power of two as it is when the 4-bit address is a power of two and outputs a value obtained by rounding up the value to a power of two in other cases.

The adder 32B adds an output (initial value) of a gray-to-bin converter 34 to an output of the MSB extractor 32A. The output of the adder 32B is input to a bit comparator 33 via a bin-to-gray converter 37. As described before in detail, also, in the third embodiment, the same effect as that of the first embodiment can be obtained.

Fourth Embodiment

Figure 10:
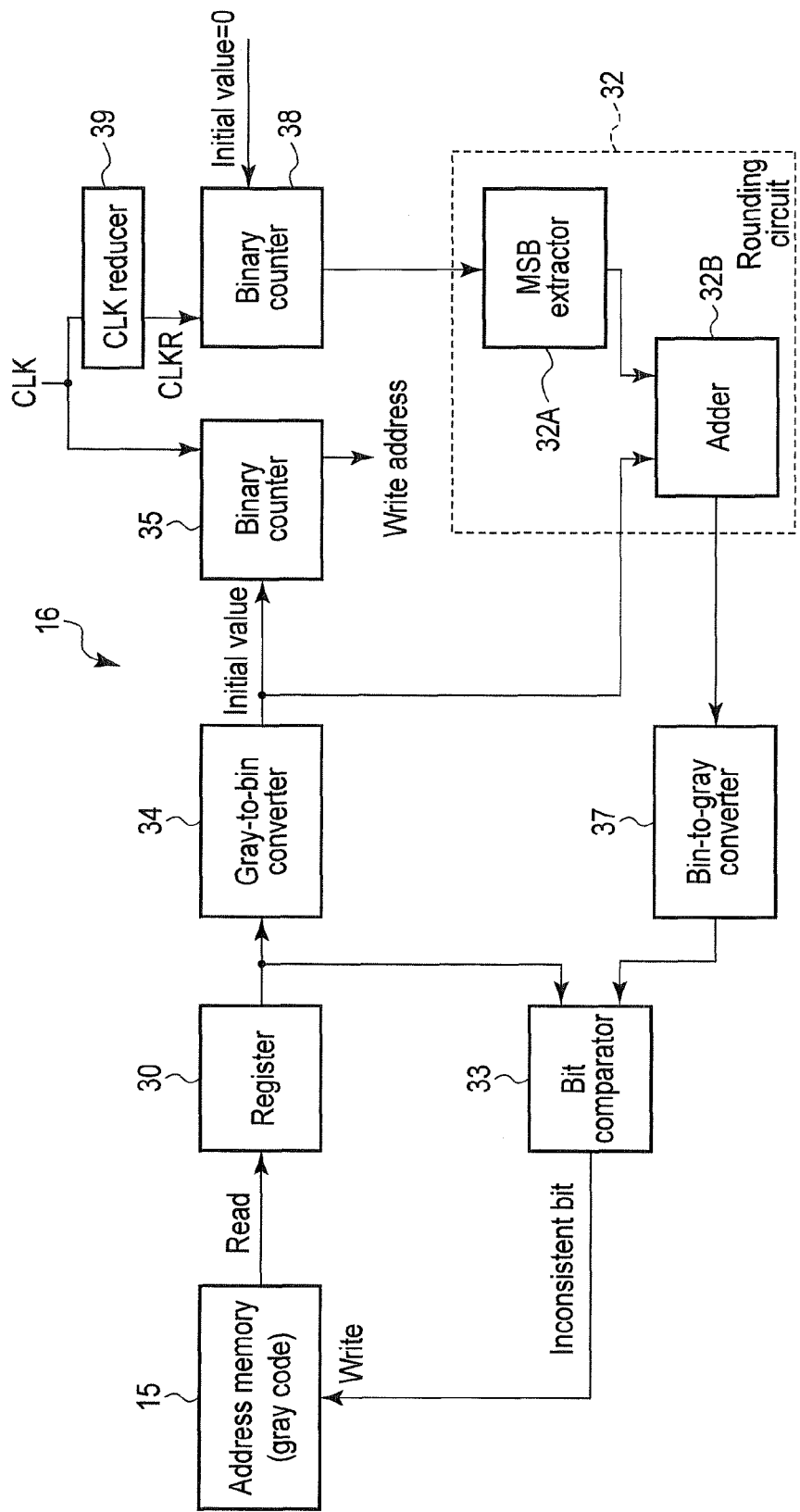
FIG. 10 is a block diagram of an address memory and address memory controller according to a fourth embodiment.

A fourth embodiment shows another configuration example of the rounding circuit 32. FIG. 10 is a block diagram of an address memory 15 and address memory controller 16 according to the fourth embodiment.

Figure 11:
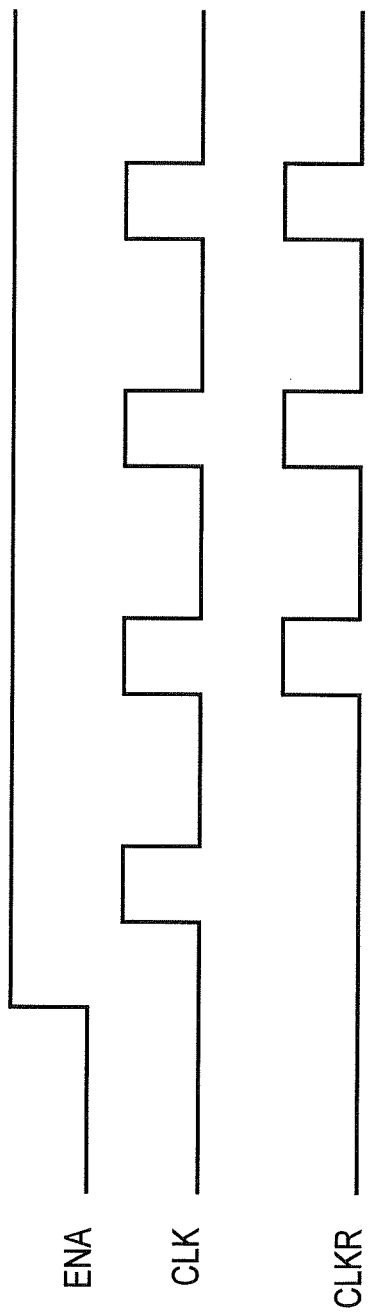
FIG. 11 is a waveform diagram of write clock CLK and clock CLKR.

In the fourth embodiment, the number of pulses of clock CLKR input to a binary counter 38 is less by one than the number of pulses of the write clock CLK generated for each write access. For this control operation, the address memory controller 16 includes a clock reducer (CLK reducer) 39. The clock reducer 39 receives the write clock CLK after the enable signal ENA is asserted and generates the clock CLKR obtained by eliminating the first one pulse of the write clock CLK (shifting by one clock cycle). FIG. 11 is a waveform diagram of write clock CLK and clock CLKR. The function of the clock reducer 39 can be realized by use of a known method using a shift register or the like.

The binary counter 38 is supplied with a clock having one pulse reduced from that of the third embodiment and the MSB extractor 32A outputs a value of a power of two in which only one-bit more significant than the MSB of the final output of the binary counter 38 is 1 (the output value is 1 when the final output of the binary counter 38 is 0). FIG. 12 is a diagram showing the relationship between an input and output of the MSB extractor 32A obtained when an address is formed of four bits.

The function of the MSB extractor 32A can be relatively easily realized. FIG. 13 is a circuit diagram showing one example of the MSB extractor 32A. Inputs of the MSB extractor 32A are A3, A2, A1, A0 and outputs thereof are B3, B2, B1, B0. In FIG. 13, the correspondence table between inputs A2, A1, A0 and outputs B3, B2, B1, B0 is also shown. Input A3 is fixed at 0.

The MSB extractor 32A includes inverters 41 to 44, AND gates 45 to 47 and NOR gate 48. Input A0 is connected to the inputs of the AND gate 47 and NOR gate 48. Input A1 is connected to the inputs of the inverter 43, AND gate 46 and NOR gate 48. The output of the inverter 43 is connected to the input of the AND gate 47. Input A2 is connected to the inputs of the inverter 42, AND gate 45 and NOR gate 48. The output of the inverter 42 is connected to the input of the AND gate 46. Input A3 is fixed at 0 and is connected to the input of the inverter 41. The output of the inverter 41 is connected to the input of the AND gate 45. The output of the AND gate 45 is connected to the input of the AND gate 47 via the inverter 44. The output of the NOR gate 48 corresponds to output B0, the output of the AND gate 47 corresponds to output B1, the output of the AND gate 46 corresponds to output B2 and the output of the AND gate 45 corresponds to output B3.

FIG. 14 is a circuit diagram showing another example of the MSB extractor 32A. The MSB extractor 32A includes inverters 50, 51 and NOR gates 52 to 54. Input A0 is connected to the inputs of the inverter 51 and NOR gate 54. The output of the inverter 51 is connected to the input of the NOR gate 53. Input A1 is connected to the inputs of the inverter 50 and NOR gates 53, 54. The output of the inverter 50 is connected to the input of the NOR gate 52. Input A2 is connected to the inputs of the NOR gates 52 to 54. The output of the NOR gate 54 corresponds to output B0, the output of the NOR gate 53 corresponds to output B1, the output of the NOR gate 52 corresponds to output B2 and input A2 corresponds to output B3.

In the above description, the first pulse of the write clock CLK is neglected and the remaining pulses are output after the enable signal ENA is asserted according to the function of the clock reducer 39. However, the essence of the present embodiment lies in that the number of pulses of clock CLKR input to the binary counter 38 is different from the number of pulses of the write clock CLK. For example, the same effect can be obtained if the last pulse of the write clock CLK is neglected when the enable signal ENA is negated. Further, the output clock of the clock reducer 39 may not be necessarily output in synchronism with the write clock CLK.

As described above in detail, according to the fourth embodiment, like the first embodiment, when address information stored in the address memory 15 is rewritten after a series of write accesses is completed, the number of to-be-rewritten bits can be two bits at maximum. As a result, the same effect as that of the first embodiment can be obtained in the fourth embodiment.

Modification

Figure 15:
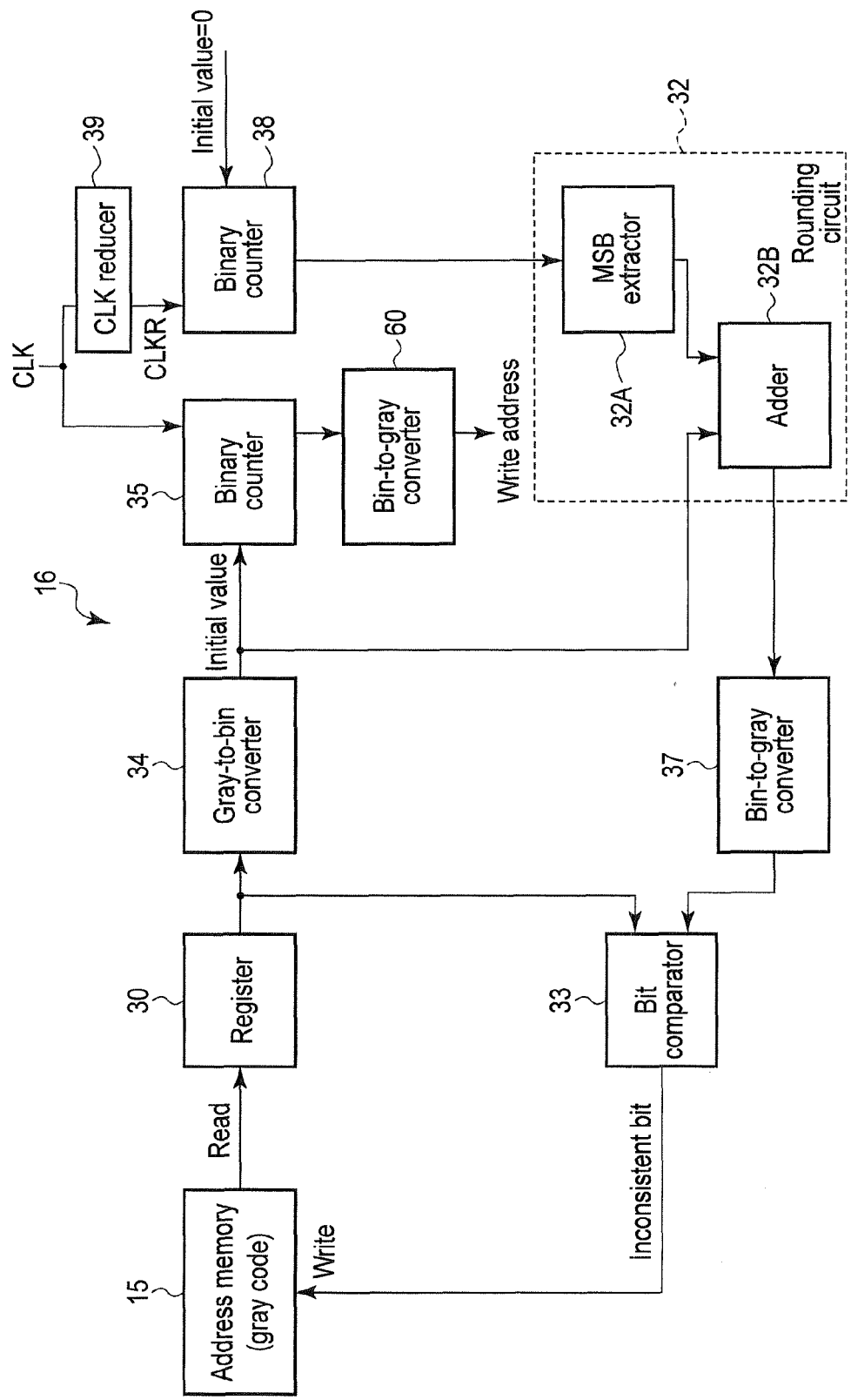
FIG. 15 is a block diagram of an address memory and address memory controller according to a modification.

A write address supplied to the nonvolatile memory 17 can be converted to a gray code. FIG. 15 is a block diagram of an address memory 15 and address memory controller 16 according to a modification. In FIG. 15, a bin-to-gray converter 60 is added to the circuit of FIG. 10. The bin-to-gray converter 60 converts an output of a binary counter 35 to a gray code. As a result, a write address formed of a gray code is supplied to the nonvolatile memory 17. According to the modification, since a change in an address for each write access can be suppressed to one bit, the number of address lines used for charging and discharging can be reduced and, as a result, the power consumption can be reduced.

Fifth Embodiment

In the second to fourth embodiments, the binary counter is used for counting up the address, but in the fifth embodiment, a gray code counter is used for counting up the address and the gray-to-bin converter and bin-to-gray converter are omitted.

Figure 16:
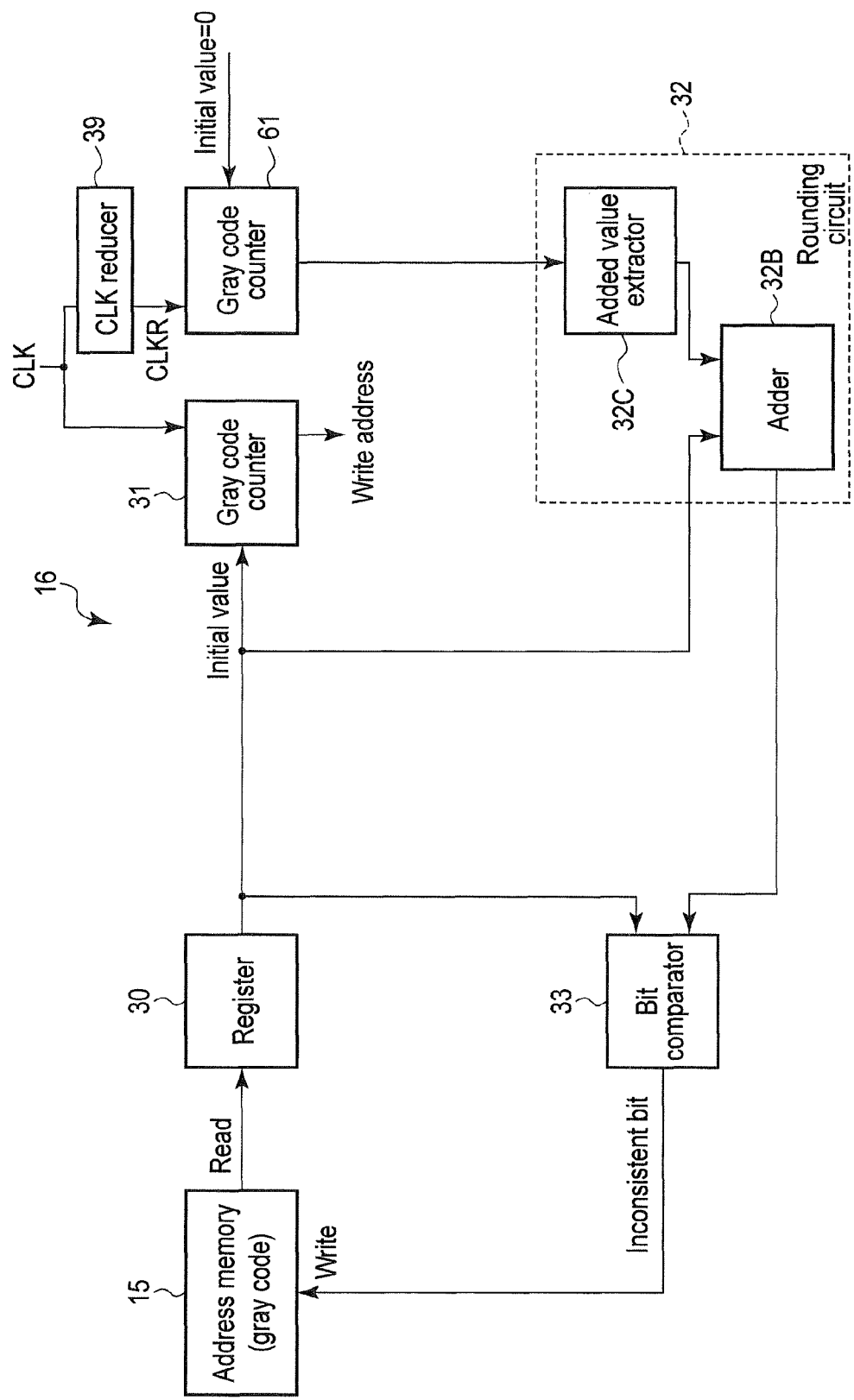
FIG. 16 is a block diagram of an address memory and address memory controller according to a fifth embodiment.

FIG. 16 is a block diagram of an address memory 15 and address memory controller 16 according to the fifth embodiment. The address memory controller 16 includes two gray code counters 31, 61. The gray code counter 31 has the same function as that of the first embodiment. The gray code counter 61 counts up an address based on the clock CLK from the clock reducer 39. The output of the gray code counter 61 corresponding to the clock CLKR is as shown in FIG. 5.

A rounding circuit 32 includes an added value extractor 32C and adder 32B. The added value extractor 32C receives the final output of the gray code counter 61. Then, the added value extractor 32C outputs a value that is equal to or larger than the final output of the gray code counter 61 and is a power of two.

The adder 32B performs a count-up operation once according to the gray code rule to add a value of a power of two to the initial value while the position of the least significant bit is adequately changed.

Specifically, the adder 32B performs the following operations.

(1) When the final output of the gray code counter 61 is 0 (when write clock CLK is one pulse), the least significant bit of the initial value is set as the least significant bit and the count-up operation is performed once to the initial value according to the gray code rule. That is, the counting up is performed only once according to the gray code rule.

(2) When the final output of the gray code counter 61 is 1 (when write clock CLK is two pulses), the second bit from the least significant bit of the initial value is set as the least significant bit and the count-up operation is performed once to the initial value according to the gray code rule and the least significant bit is inverted.

(3) When the added value is "4 (the second power of 2)", the third bit from the least significant bit is set as the least significant bit, the count-up operation is performed once to the initial value according to the gray code rule, the least significant bit is fixed and the second bit from the least significant bit is inverted.

(4) When the added value is "8 (the third power of 2)", the fourth bit from the least significant bit is set as the least significant bit, the count-up operation is performed once to the initial value according to the gray code rule, the least significant bit and second bit are fixed and the third bit from the least significant bit is inverted.

A similar idea is applied when the added value is the fourth power or more of 2.

The operation of the other circuits is the same as that of the first embodiment.

As described above in detail, in the fifth embodiment, when address information stored in the address memory 15 is rewritten after a series of write accesses (all of the write accesses while the enable signal ENA remains asserted) is completed, the number of to-be-rewritten bits can be suppressed to two at maximum. Further, a memory system 10 can be realized without using the gray-to-bin converter and bin-to-gray converter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a nonvolatile memory that stores data according to a write access;
    an address memory that stores a first address described with a gray code;
    a first counter that counts up the first address for each write access, generates a second address as the count-up result, and supplies the second address to the nonvolatile memory;
    a rounding circuit configured to calculate a third address that is equal to or larger than a final output of the first counter and larger than the first address by one or a power of two after a series of write accesses is completed; and
    a controller that rewrites the third address in the address memory.

2. The device of claim 1, further comprising a bit comparator configured to compare the first address with the third address, the controller rewriting an inconsistent bit between the first address and the third address in the address memory.

3. The device of claim 1, wherein the first counter receives a first clock including one or more pulses corresponding to write accesses and counts up the first address in response to a pulse of the first clock.

4. The device of claim 3, further comprising a second counter that counts a pulse of the first clock, wherein
    the rounding circuit includes
        an extractor that outputs a value of a final output of the second counter as it is when the final output is one or a power of two and outputs a value that is larger than the final output of the second counter and is a power of two when the final output of the second counter is neither one nor a power of two, and
        an adder that adds an output of the extractor to the first address read from the address memory.

5. The device of claim 4, further comprising:
    a first converter that converts the first address read from the address memory to a binary, and
    a second converter that converts the third address output from the rounding circuit to a gray code, wherein
    the first counter is a binary counter.

6. The device of claim 5, further comprising a third converter that converts the second address output from the first counter to a gray code.

7. The device of claim 3, further comprising a second counter that counts a pulse of a second clock that is one-pulse less than the first clock, wherein
    the rounding circuit includes
        an extractor that outputs a value (that is 1 when the final output of the second counter is 0) that is a power of two in which only a more significant bit than the most significant bit of the final output of the second counter is 1 and
        an adder that adds an output of the extractor to the first address read from the address memory.

8. The device of claim 7, further comprising
    a first converter that converts the first address read from the address memory to a binary, and
    a second converter that converts the third address output from the rounding circuit to a gray code, wherein
    the first counter is a binary counter.

9. The device of claim 8, further comprising a third converter that converts the second address output from the first counter to a gray code.

10. The device of claim 1, further comprising a register that temporarily stores the first address read from the address memory.

11. The device of claim 1, wherein the nonvolatile memory is an MRAM.

12. A memory system comprising:
    a sensor;
    a nonvolatile memory that stores data of the sensor according to a write access;
    an address memory that stores a first address;
    a first counter that counts up the first address for each write access and supplies a second address which is the count-up result to the nonvolatile memory; and
    a controller that rewrites a final address in the address memory after a series of write accesses is completed.

13. The system of claim 12, wherein the first address is described with a gray code.

14. The system of claim 13, further comprising a rounding circuit configured to calculate a third address that is equal to or larger than a final output of the first counter and larger than the first address by one or a power of two after a series of write accesses is completed, wherein
    the controller rewrites the third address in the address memory.

15. The system of claim 14, further comprising a bit comparator configured to compare the first address with the third address, the controller rewriting an inconsistent bit between the first address and the third address in the address memory.

16. The system of claim 14, wherein the first counter receives a first clock including one or more pulses corresponding to write accesses and counts up the first address in response to a pulse of the first clock.

17. The system of claim 16, further comprising a second counter that counts a pulse of the first clock, wherein
    the rounding circuit includes
        an extractor that outputs a value of a final output of the second counter as it is when the final output is one or a power of two and outputs a value that is larger than the final output of the second counter and is a power of two when the final output of the second counter is neither one nor a power of two, and
        an adder that adds an output of the extractor to the first address read from the address memory.

18. The system of claim 17, further comprising:
    a first converter that converts the first address read from the address memory to a binary, and
    a second converter that converts the third address output from the rounding circuit to a gray code, wherein
    the first counter is a binary counter.

19. The system of claim 18, further comprising a third converter that converts the second address output from the first counter to a gray code.

20. The system of claim 16, further comprising a second counter that counts a pulse of a second clock that is one-pulse less than the first clock, wherein
    the rounding circuit includes
        an extractor that outputs a value (that is 1 when the final output of the second counter is 0) that is a power of two in which only a more significant bit than the most significant bit of the final output of the second counter is 1 and
        an adder that adds an output of the extractor to the first address read from the address memory.

* * * * *